United States Patent [19]

Hooper et al.

[11] Patent Number: 5,606,195

[45] Date of Patent: Feb. 25, 1997

[54] HIGH-VOLTAGE BIPOLAR TRANSISTOR UTILIZING FIELD-TERMINATED BOND-PAD ELECTRODES

[75] Inventors: William W. Hooper, Westlake Village; Michael G. Case, Thousand Oaks; Chanh N. Nguyen, Newbury Park, all of Calif.

[73] Assignee: Hughes Electronics, Los Angeles, Calif.

[21] Appl. No.: 578,796

[22] Filed: Dec. 26, 1995

[51] Int. Cl.⁶ .......................... H01L 29/44; H01L 29/52
[52] U.S. Cl. .......................... 257/488; 257/587; 257/560; 257/502; 257/547
[58] Field of Search ....................... 257/488, 508, 257/506, 503, 502, 517, 526, 587, 588, 547

[56] References Cited

U.S. PATENT DOCUMENTS

| | | | |
|---|---|---|---|
| 3,977,020 | 8/1976 | Enzlin et al. | 257/586 |
| 4,707,720 | 11/1987 | Shirai et al. | 257/488 |
| 4,868,921 | 9/1989 | Adler | 257/506 |
| 4,885,628 | 12/1989 | Nagai et al. | 257/506 |
| 5,109,266 | 4/1992 | Kida et al. | 257/488 |
| 5,455,189 | 10/1995 | Grubisich | 437/34 |
| 5,493,149 | 2/1996 | Jerome et al. | 257/588 |

FOREIGN PATENT DOCUMENTS 99766  6/1984  Japan .

*Primary Examiner*—Sara W. Crane
*Assistant Examiner*—Alexander Oscar Williams
*Attorney, Agent, or Firm*—Leonard A. Alkov; Wanda K. Denson-Low

[57] ABSTRACT

A high-voltage bipolar transistor and fabrication method that comprises a shield electrode (or field-termination electrode) located between bond pads and underlying semiconductor material. The shield electrode is sandwiched between two isolating dielectric layers. High-voltage applied to the bond pad establishes an electric field between the bond pad and the shield electrode), preventing field penetration into and inversion of the underlying semiconductor material. Using this overlapping field-termination structure, low leakage current and high breakdown voltage is maintained in the transistor. The present overlapping field-termination structure provides an effective field termination underneath the bond pads, and because of its overlapping design, provides for a more compact transistor.

10 Claims, 3 Drawing Sheets

HIGH-VOLTAGE BIPOLAR TRANSISTOR UTILIZING FIELD-TERMINATED BOND-PAD ELECTRODES

BACKGROUND

The present invention relates generally to bipolar transistors and fabrication methods, and more particularly, to a high-voltage bipolar transistor that employs field-terminated bond-pad electrodes and a method of fabricating same.

Bipolar transistor technology is well known, dating back to the invention of the germanium junction transistor in 1948 by Shockley, Bardeen and Brattain. In 1951, Shockley proposed the use of the abrupt heterojunction as an emitter-base junction in a bipolar transistor, which is disclosed in U.S. Pat. No. 2,569,347. Since that time, the fabrication of both single and double-heterojunction bipolar transistors in gallium arsenide (GaAs) and indium phosphide (InP) has received considerable attention. Description to such transistors may be found, for example, in "Fabrication of Self-Aligned GaAs/AlGaAs and GaAs/InGaP Microwave Power Heterojunction Bipolar Transistors", by J. Ren, et al, J. Vac. Sci. Technol. B. Vol. 12, No. 5, pp. 2916–2928, September, 1994, "Comparison of InGaP/GaAs Single- and Double-Heterojunction Bipolar Transistors with Carbon Doped Base", by A. W. Hanson, et al, IEEE Electron Device Letters, Vol. 14, No. 1, pp. 25–27, June, 1994, "High-Linearity Power X-Band GaInP/GaAs Heterojunction Bipolar Transistor", by W. Liu, et al, IEEE Electron Device Letters, Vol. 15, No. 6, pp. 190–192, June, 1994, "Fabrication and Characterization of High-Performance InP/InGaAs Double Heterojunction Bipolar Transistors", by K. Kurishima, et al, IEEE Transactions on Electron Devices, Vol. 41, No. 8, pp. 1319–1326, August, 1994, "60 Ghz AlInAs/GaInAs/InP DHBTs Grown by MOCVD+MBE", by W. E. Stanchina, et al, 1991 Tech. Dig., p VIA-6, and "InP-Based Heterojunction Bipolar Transistors: Performance Status and Circuit Applications", by P. M. Asbeck, et al, Paper MA. 1, presented at the Second International Conference on InP and Related Materials, Conf. Proc., pp. 2–5.

In addition to the above mentioned applications, there is also a current need for high-speed switching transistors with operating voltage in excess of 200 V, for example, for use in VHF resonant power converters. Until now, no device existed that could satisfy this need. Using silicon technology, high-voltage switching can be achieved at essentially audio frequencies, and high-speed switching can be achieved only at low-voltage. High-voltage switching devices of GaAs-based heterojunction bipolar transistors at VHF frequencies have been developed by the assignee of the present invention that have higher power gain and efficiency than the best available silicon devices. However, prior to the present invention, there has been no device structure that provides a highly reliable VHF switching transistor for resonant power supply applications that has an operating voltage in excess of 200 V.

The use of a field-plate and equipotential ring, such as are disclosed in "Effect of Surface Fields on the Breakdown Voltage of Planar Si p-n Junctions", by A. S. Grove, et al, IEEE Trans. 14 Electron Dev., ED-14, No. 3, pp. 157–162 (1967), and "Design Considerations for High-Voltage Overlap Annular Diodes", by D. S. Zoroglu, et al, IEEE Trans. Electron Dev., ED-19, No. 8, pp. 4–8, (1972) are well known for improving p-n junction breakdown voltage and reliability in silicon technology. However, these structures are concentric rings, and no mention is made in these papers regarding an overlapping configuration such as is employed in the present invention.

Accordingly, it is an objective of the present invention to provide for an improved high-voltage bipolar transistor and a method of fabricating same.

SUMMARY OF THE INVENTION

To meet the above and other objectives, the present invention provides for a high-voltage bipolar transistor and fabrication method that comprises a shield electrode (or field-termination electrode) located between a bond pad electrode and the underlying semiconductor material. The shield electrode is sandwiched between two isolating dielectric layers. High-voltage applied to the bond pad electrode establishes an electric field between the bond pad electrode and the shield electrode, preventing field penetration into and inversion of the underlying semiconductor material. Using this overlapping field-termination structure, low leakage current and high breakdown voltage are maintained. In addition to providing effective field-termination underneath the bond pad electrode, the present overlapping field-termination structure provides for a more compact transistor structure.

The present invention improves on the current state-of-the-art in silicon as well as III–V-based bipolar transistors, in that, heretofore, there has been no such device in existence which has the combined high bandwidth and high operating voltage. The highest performance silicon bipolar switching device has a 50 V base-collector breakdown voltage compared to 250 V for the present gallium arsenide-based device. The present transistor has wider bandwidth and higher power gain and efficiency than the silicon counterpart at the same frequency. No other III–V compound bipolar transistor exists with base collector breakdown voltage higher than about 50 V. No device exists in either silicon or III–V compounds that employs the present field-terminated bond-pad electrode.

The concepts of the present invention may be applied to any bipolar transistor regardless of whether it is homojunction, single or double heterojunction, fabricated in any material system. There is an ever-increasing demand for high-voltage, high-speed switching transistors for use in light-weight, low-cost high-efficiency resonant power converters. Bipolar transistors fabricated on high-speed semiconductor material, such as gallium arsenide (GaAs) and indium phosphide (InP) can satisfy this critical need. However, because of the metallurgical/chemical properties of these materials, the maximum temperature which can be tolerated during the fabrication process is limited to about 350° C. This temperature limitation determines the methods by which dielectric layers forming junction passivation and bond-pad support layers can be fabricated. Typically, these dielectric layers are deposited by plasma-enhanced chemical vapor deposition (PECVD) at 200°–250° C. A practical limitation on the dielectric thickness is about 1 micron prior to its cracking and delamination from the semiconductor surface. During transistor operation, this moderately thin dielectric layer is subjected to potential differences in excess of 200 V, and in the case of bond pad electrodes located on top of the dielectric surface above the semiconductor material, the electric field induced is sufficient to cause inversion of the underlying semiconductor material, resulting in excessive leakage current and low breakdown voltage.

BRIEF DESCRIPTION OF THE DRAWINGS

The various features and advantages of the present invention may be more readily understood with reference to the

Figure 1:
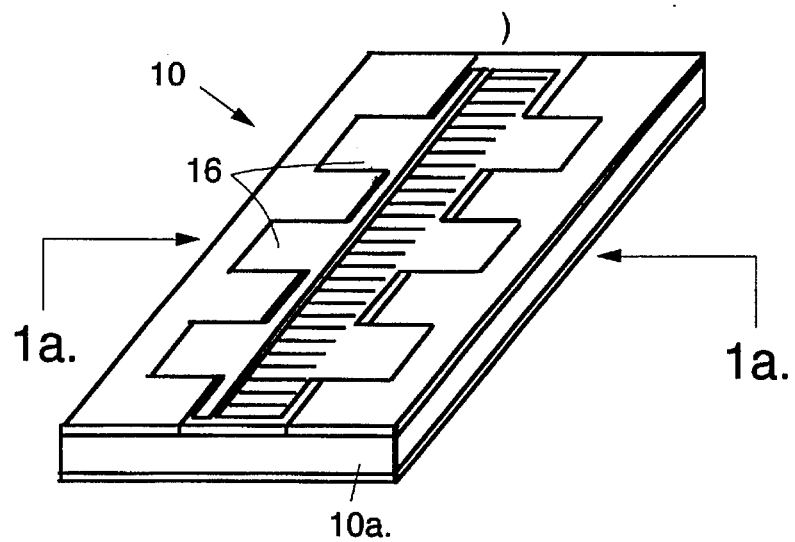
Figure 1A:
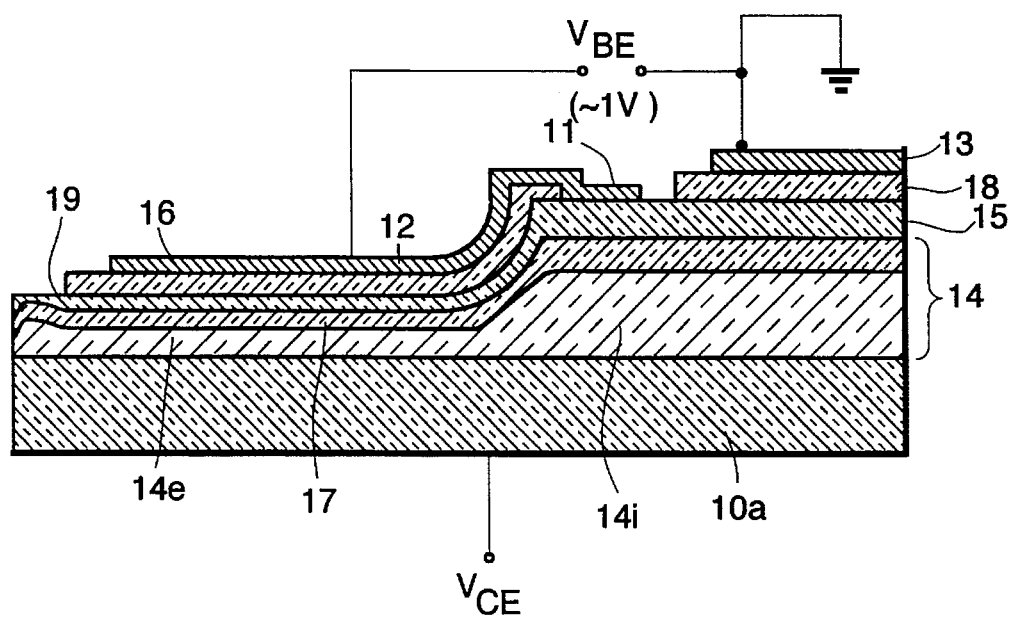
Figure 3:
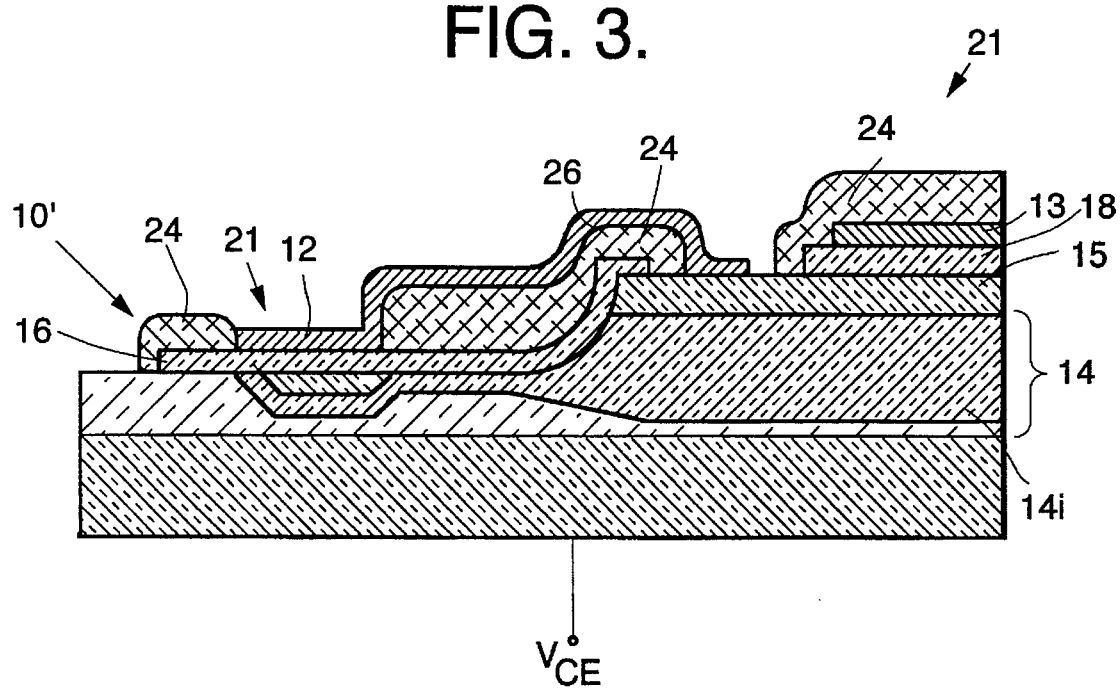
Figure 4:
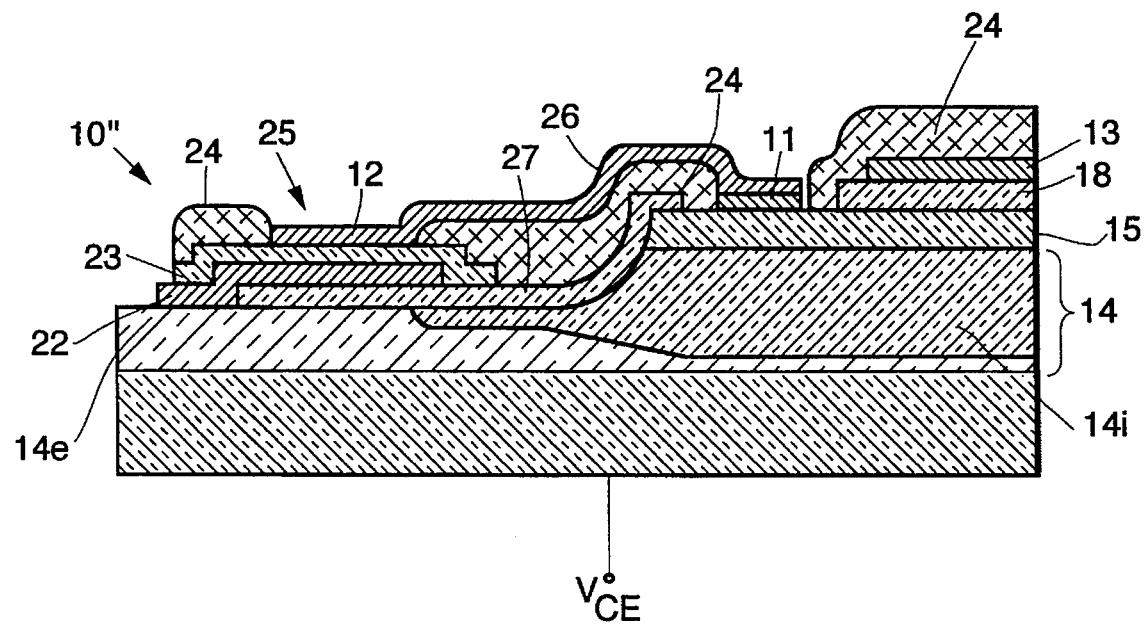

3 following detailed description taken in conjunction with the accompanying drawings, wherein like reference numerals designate like structural elements, and in which:

FIG. 1 is a perspective view or die plan of a conventional bipolar transistor fabricated without channel-stop or guard-ring structures normally used to prevent device failure due to surface charge migration;

FIG. 1a is a cross-sectional representation of the bipolar transistor of FIG. 1;

FIGS. 2a–2d results obtained in an experiment made during development of the present invention;

FIG. 3 illustrates a cross-sectional view of a transistor structure having thick polyimide used as a bond-pad interconnect support layer and silicon nitride, silicon dioxide, or other suitable dielectric as a bond-pad support layer; and FIG. 4 shows a cross-sectional representation of a preferred embodiment of the bipolar transistor in accordance with the principles of the present invention.

DETAILED DESCRIPTION

By way of introduction, the importance of charges on semiconductor surfaces and their effects on the electrical properties of the underlying substrate material have been acknowledged for some time. It is considered relevant to the present invention, and is presented in detail herein to establish a bridge between what is known and what is new that is provided by the present invention.

The presence of mobile surface charges has been postulated by several authors in order to account for certain surface phenomena. For example, W. L. Brown in Phys. Rev. 91, p 518, 1953 explained bias and ambient-dependent surface conductance in germanium by surface charge motion. Statz et al. in Phys Rev. 111, p 169, 1958 postulated charge motion to account for variations in conductivity in surface channels. Atalla et al. in Suppl. Proc. Inst. Elec. Engrs. (London), Pt. B 106, (1953) 1130, discussed a model in which an electric field separates ions of opposite charge on an oxidized surface of a p-n junction (the classical "Atalla Model"), thus explaining spreading of channels, as observed by photocurrents, and "drift" of diode current-voltage characteristics. In addition, various authors have proposed models for the mechanism of charge transport on an oxide surface covering a semiconductor material. In 1964, Shockley et al. in "Mobile Electric Charges on insulating Oxides with Applications to Oxidized p-n Junctions", Surface Science, 2, 277 (1964) experimentally verified the validity of the "Atalla Model". In this definitive work, Shockley et al. demonstrated the effects of surface charges on leakage current and anomalous breakdown of oxidized silicon p-n junctions.

In 1967, Grove et al. in "Effect of Surface Fields on The Breakdown Voltage of Planar Si p-n Junctions" described the effect of field-plates and surface fields on the breakdown voltage of planar silicon p-n junctions. Subsequent papers by these and other authors described the use of a field-plate and guard-ring to improve junction breakdown voltage and reliability. This is discussed in the Zoroglu et al. paper cited above, for example. The "overlap" in the Zoroglu paper refers to metal layers that overlap a supporting dielectric layer. Since this earlier work, the use of a field-plate, or "extended base contact", as well as a guard ring have been used in the fabrication of conventional diffused high-voltage silicon bipolar transistors.

In contrast to the above, a bipolar transistor and fabrication method in accordance with the present invention is an epitaxially-grown device structure in which device isolation is achieved using a mesa etching process. Optimization of base-collector junction breakdown voltage is achieved by etch-contouring the junction, and nearly ideal (bulk) breakdown is realized without the use of a conventional surface field plate. However, base and emitter bond pad electrodes and their associated interconnections with transistor base and emitter contacts must reside on the surface of the device, separated from this surface by a dielectric layer. In this case, the entire base-collector (and emitter-collector) potential is applied between the bond pad electrodes and the surface of the underlying semiconductor material. Although no field-plate is employed for breakdown voltage enhancement, the bond pad electrodes and interconnects act as a field-plate, and have design problems normally associated with this type of structure. In the case of transistors operated with a base-collector voltage in excess of 200 V, surface inversion of the semiconductor material underneath the bond pad electrodes and interconnecting metalization can occur. Furthermore, the area of inversion can extend beyond the boundaries of the bond pad electrodes and interconnect metalization due to surface charge migration, resulting in the time-dependent growth of a conducting channel at the semiconductor-dielectric interface. If this channel is allowed to "grow" to the edge of the transistor, a field-induced junction results, with very low breakdown voltage. It is well known to those involved with silicon processing technology that a channel-stop diffusion, combined with a metallized guard-ring structure can prevent this failure mode. The present invention, however, makes use of a guard-ring in conjunction with a unique overlapping bond-pad structure, to form what is referred to as a "field-terminated bond pad electrode".

Referring now to the drawing figures, FIGS. 1 and 1a illustrate the problem solved by the present invention. FIG. 1a is a cross-sectional representation of a conventional bipolar transistor 10, shown as a die plan perspective view in FIG. 1, fabricated without the use of channel-stop or guard-ring structures normally used to prevent device failure due to surface charge migration. The cross-section of the conventional bipolar transistor 10 of FIG. 1a is shown taken through lines 1a—1a of the die plan of FIG. 1. For simplification, only the region including a base contact 11 and bond pad 12 is shown. The transistor 10 is shown as an N-P-N type, but the analysis applies to a P-N-P type structure as well. The transistor 10 is shown in a grounded-emitter configuration.

The transistor 10 includes a substrate 10a (shown as an N+ substrate 10a) which has a collector bias voltage applied thereto. A collector 14 (lightly-doped N− in this example) is formed adjacent a top surface of the substrate 10a, and is shown as the entire N− layer disposed on top of the N+ substrate 10a. The collector 14 has an intrinsic portion 14i and an extrinsic portion 14e. A depletion layer 17 is shown adjacent the top surface of the collector 14 that is formed during operation of the transistor. A base 15 (P+ base 15) is formed on top of the intrinsic portion 14i of the collector 14. A bond pad dielectric layer 16 is formed above the extrinsic portion 14e of the collector 14 that slightly overlaps the base 15. A base contact 11 is formed on the base 15, and a base bond pad 12 is formed on the bond pad dielectric layer 16 that couples to the base contact 11. An emitter 18 is formed on the base 15 and an emitter contact 13 is formed on the emitter 18.

In operation, with the base-emitter junction forward-biased, the voltage on the base contact 11 will be within 1 V of ground potential. The application of reverse bias to the collector 14 therefore applies essentially the entire potential between the base-collector junction as well as the base bond pad 12, the bond pad interconnecting electrode 26 and the surface of the extrinsic portion 14e of the collector 14. For low values of collector bias, the surface of the extrinsic portion 14e of the collector 14 will become depleted; identified as depletion layer 17. Further increase in the bias applied to the collector 14 causes the surface of the extrinsic portion 14e of the collector 14 to become inverted, i.e., positive mobile charge (holes) will be attracted to the interface between the dielectric 16 and the N− collector 14. This inversion layer is shown as inversion layer 19. The magnitude of reverse bias required to cause inversion depends upon a number of factors, including the thickness of the dielectric 16, its dielectric constant, the surface state density at the interface between the dielectric 16 and extrinsic portion 14e of the collector 14, the position of the Fermi level at the interface between the dielectric 16 and extrinsic portion 14e of the collector 14, and the amount of doping of the collector 14.

In the absence of charge migration on the device surface, the depletion and inversion layers 17, 19 underneath the bond pad 12 terminate at the edge of the bond pad 12. However, in the presence of a moist ambient, such as room air, surface charge migrates along the device surface due to the high lateral electric field at the edge of the bond pad 12. This phenomenon is discussed in "A Study of Failure Mechanisms in Silicon Planar Transistors", Technical Documentary Report, by E. H. Snow, December, 1965, RADC Contract. Negative charges (OH− ions from dissociated water molecules on the device surface) move away from the edge of the bond pad 12 eventually reaching the edge of the transistor 10. The p-type channel has extended the P+ base 15 to the edge of the transistor 10, and avalanche breakdown can occur at the edge of the transistor 10 at a value well below the bulk breakdown value of the base-collector junction.

The solution to the problem described above is two-fold. First, avoid inversion of the surface of the lightly doped extrinsic portion 14e of the collector 14 underneath the bond pad dielectric layer 16, and second, prevent the migration of charge on the upper surface of the device or render it ineffective with regard to causing any anomalous breakdown characteristic. Surface inversion can be avoided by making the bond pad 12 and bond pad dielectric layer 16 of sufficient thickness (several micrometers) and low dielectric constant (less than 4) so that negligible charge is displaced at the interface between the bond pad dielectric layer 16 and the extrinsic portion 14e of the collector 14 for all base-collector bias conditions. Charge migration to the edge of the transistor 10 can be avoided by the use of the guard ring structure discussed above.

As pointed out above, the superior electronic properties of bipolar transistors fabricated in materials such as gallium arsenide (GaAs) and indium phosphide (InP) make them ideally suited for high-speed high-voltage applications. Because of the inherently low minority carrier lifetime in these materials compared to silicon, they are well-suited to use in high-speed switching applications. The use of these III–V compounds, however, imposes restrictions on the maximum allowable temperature that they can be subjected to during fabrication. Temperatures in excess of 450° C. causes the evolution of arsenic (As) from the GaAs surface resulting in gallium puddle formation. In the case of InP, phosphorous is evolved resulting in indium puddle formation.

Considerable care must therefore be taken to encapsulate these materials during high-temperature process cycles in order to prevent dissociation. However, these preventative measures are incompatible with process steps for device fabrication using these materials. Furthermore, the diffusion of contact metals becomes a serious problem in these materials at temperatures above about 350° C. As a result, the techniques for depositing dielectric layers that are commonly used in silicon processing, such as high-temperature thermally grown oxides, cannot be employed in the fabrication of GaAs and InP-based bipolar transistors. The technique commonly used for depositing dielectrics for these materials is plasma-enhanced chemical vapor deposition (PECVD). Films of silicon nitride and silicon dioxide can be deposited at temperatures ranging from room temperature to 350° C. Using this deposition technique, the maximum thickness that can be achieved before cracking and delamination of the film occurs is about 1 μm, which does not provide for a thick dielectric. This problem can be alleviated by using a thick layer of polyimide, which has dielectric constant of 3–3.5. Polyimide films can be applied with thicknesses in excess of 10 μm, and these films can be adequately cured at 250° C., which is well within temperature constraints.

The fact that a thick polyimide film used for the bond pad dielectric layer 16 eliminates the deleterious effects of charge migration and surface inversion was verified by fabricating bipolar transistors 10 in InP material for the purposes of illustration. One portion of the material was processed with a 1 μm silicon nitride as the bond pad dielectric layer 16, while another portion was processed with 3 μm of polyimide as the bond pad dielectric layer 16. All other processing steps were identical. In the case of the sample with the silicon nitride bond pad dielectric layer 16, after completion of the fabrication process, a curve-tracer measurement of the base-collector breakdown voltage at room ambient temperature showed the classical symptoms of charge migration and channel formation. The breakdown voltage was initially 150 V but in a few seconds the leakage current abruptly increased with a reduction in the breakdown voltage to about 2 V. Removal of the base-collector bias allowed redistribution of the surface charge to its prestressed state. Remeasuring the breakdown voltage again showed it to be 150 V, quickly transitioning to 2 V. The breakdown voltage could be stabilized at 150 V for long periods of time with the application of surface coatings that neutralized or "froze" the surface charges in place. Although this serves as verification of surface charge migration and its role in breakdown voltage degradation, it is not the best solution for long-term reliability.

Figure 2A:
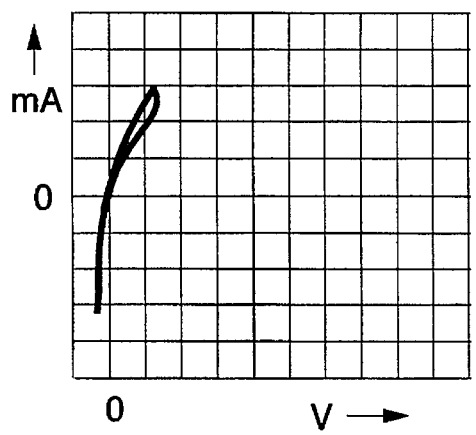
Figure 2B:
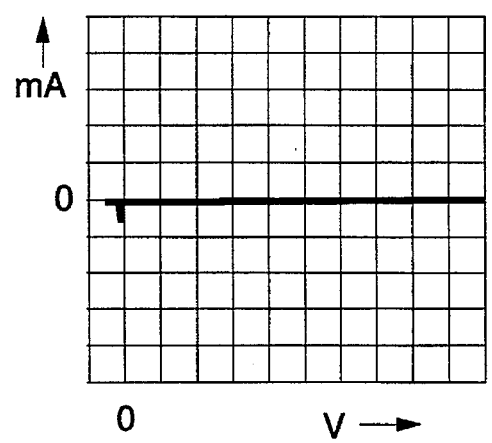
Figure 2C:
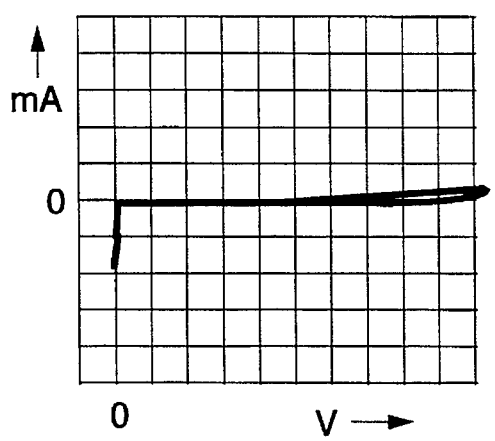
Figure 2D:
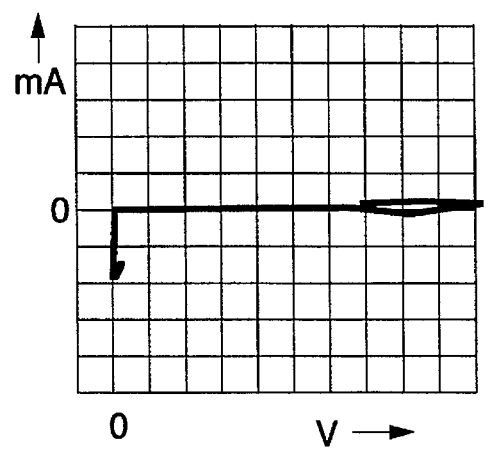

FIGS. 2a–2d show results obtained in the experiment described above. For the purpose of the test, the maximum base-collector reverse-bias voltage was 100 V. Zero voltage is at the extreme left of the horizontal axis, and zero current is midway on the vertical axis. FIGS. 2a and 2b show the base-collector I–V characteristic of the sample with a 1 μm silicon nitride dielectric 16 about two seconds after the application of 100 V reverse bias in room ambient. The 100 V characteristic did not remain stable sufficiently long to obtain a photograph, but degraded to a nearly ohmic characteristic. The bias was removed, the device surface coated with isopropyl alcohol, and the characteristic remeasured. The result is shown in FIG. 2b. Polar solvents such as isopropyl alcohol neutralize the surface charge, preventing its migration. As long as the surface remained wet, the characteristic of FIG. 2b was preserved. Upon evaporation of the alcohol the characteristic reverted to that of FIG. 2a. A removable, nonvolatile resin was next applied to the device surface and its breakdown characteristic was measured. A stable 100 V display was observed, which was identical to that of FIG. 2b. This characteristic remained unchanged for 48 hours, which was the duration of the test.

This experiment reveals the following important points. First, the deleterious effects of surface inversion and charge migration on bipolar transistor breakdown voltage in silicon bipolar transistors play the same role in other material systems such as GaAs and InP. Second, a thick bond pad dielectric layer 16, such as polyimide, disposed beneath the transistor bond pads 12 and pad interconnects prevents the interaction of surface charges with the underlying semiconductor material. This is evidenced by the stability of the base-collector breakdown voltage illustrated in FIGS. 2c and 2d.

Although it has been shown that a thick bond pad dielectric layer 16 having a low dielectric constant produces the desired result, it does not provide the best platform for wire bonding to the transistor 10. The best platform for bonding is achieved using a bond pad dielectric layer 16 comprising either silicon nitride or silicon dioxide which provides better bond-pad adhesion and mechanical stability than polyimide. Based on this, a cross-sectional representation of a transistor 10' is as shown in FIG. 3. More specifically, FIG. 3 illustrates a cross-sectional view of a transistor 10' having thick polyimide used as a bond pad interconnect support layer 19 and silicon nitride (or silicon dioxide) for the bond pad support dielectric 16. A dielectric island of silicon nitride, silicon dioxide, or other suitable dielectric (comprising the bond pad support dielectric 16) is defined in the area where the bond pad 12 is to be located. This dielectric island is sufficiently thick to withstand (stand off) the maximum base collector voltage. A layer of polyimide comprising the bond pad interconnect support layer 24 is deposited on the entire surface of the transistor 10', and windows 21 are opened to provide for metal contact 13 to the base-emitter metalization as well as the bond pad dielectric layer 16. Intrinsic collector 14i and base 15 are also shown in FIG. 3. For this transistor 10', the high-voltage applied to the base and emitter bond pads 12, 13 will invert the extrinsic collector 14e underneath the bond pad interconnecting electrode 26, as indicated in FIG. 3. However, since it is desirable to prevent surface inversion in all areas of the surface of the transistor 10', the final preferred structure will be described with reference to FIG. 4.

FIG. 4 shows a cross-sectional representation of a preferred embodiment of the present bipolar transistor 10". The fabrication process used to produce the present bipolar transistor 10" is as follows. A first dielectric layer 27 comprising either silicon nitride or silicon dioxide is deposited and etched as indicated. The thickness of the first dielectric layer 27 (nominally 1000–2000 Å) is not critical, since no bias is applied between it and the underlying semiconductor material. Next, a metal guard-ring metalization 22 is formed as shown, which is ohmically connected to the extrinsic portion 14e of the collector 14. This guard-ring metalization 22 forms a field termination electrode 22, which is the heart of the present invention. A second dielectric layer 23, (preferably silicon dioxide to reduce parasitic capacitance) is deposited to a thickness of about 1 µm and patterned as shown. The surface of the transistor 10" is then coated with a 3–4 µm thick layer 24 of polyimide. Windows 25 are etched in the layer 24 of polyimide in order to allow metalization of the bond pads 12, pad interconnects 26, and the base and emitter contacts 11, 13. Intrinsic collector 14i and base 15 are also shown in FIG. 4.

Application of base-collector bias establishes an electric field between the base (and emitter) bond pads 12, 13 and the field-termination electrode 22. This field, which may be as high as $5 \times 10^6$ V/cm, is confined within the structure defined by the bond pad 12 and field-termination electrode 22. No external electric field can penetrate the extrinsic portion 14e of the collector 14 in this region. The interface between the first dielectric layer 27 below the field-termination electrode 22 and the surface of the extrinsic portion 14e of the collector 14 remains as it was after the deposition of the first dielectric layer 27, regardless of the base-collector voltage. The field-termination electrode 22 is made larger than the bond pad 12 by an amount necessary to reduce the effect of a fringing field reaching from the bond pad 12 into the extrinsic portion 14e of the collector 14. A transition is made from the second dielectric layer 23 comprising the bond pad dielectric layer 16 to the thick layer 24 of polyimide well within the area of the bond pad 12 to ensure that all metalization outside the bond pad 12 resides on the thick layer 24 of polyimide. An additional advantage of using a thick layer 24 of polyimide as a support layer for the bond pad interconnect electrodes 26 is that it reduces parasitic capacitance between the pad interconnect electrodes 26 and the underlying extrinsic portion 14e of the collector 14.

An additional function of the field-termination electrode 22 is that of the more conventional guard-ring. Although the thick layer 24 of polyimide ensures a very weak interaction between the bond pad 12 and the surface of the extrinsic portion 14e of the collector 14, surface depletion can occur. To what extent this occurs depends, among other factors, on the magnitude of the base-collector bias. The presence of the field-termination electrode 22, however, "clamps" the outer edge of the depletion layer at the inner edge of the field-termination electrode 22, as shown in FIG. 4. Charge migration from the outer edge of the bond pad 12 to the edge of the transistor 10" has no effect since the induced electric field terminates on the metalization of the field-termination electrode 22.

Thus, a high-voltage bipolar transistor that employs field-terminated bond-pad electrodes and fabrication method have been disclosed. It is to be understood that the described embodiment is merely illustrative of some of the many specific embodiments which represent applications of the principles of the present invention. Clearly, numerous and varied other arrangements can be readily devised by those skilled in the art without departing from the scope of the invention.

What is claimed is:

1. A high-voltage bipolar transistor comprising:

a substrate;

a collector disposed on the substrate;

a base disposed on a first portion of the collector;

an emitter disposed on the base;

an emitter contact disposed on the emitter;

a first support dielectric layer disposed on a second portion of the collector and on a portion of the base;

a field termination electrode disposed on the first support dielectric layer that contacts the collector;

a second dielectric layer disposed over the field termination electrode;

a thick dielectric layer disposed over exposed portions of the second dielectric layer, the first support dielectric layer, the emitter, and the emitter contact, and wherein the thick dielectric layer has openings therein at locations for a bond pad, pad interconnect, and base and emitter contacts; and a bond pad disposed in an opening above the first support dielectric layer and field termination electrode and which is disposed on the thick dielectric layer and contacts the base to thereby provide a structure in which the bond pad overlaps the field termination electrode with a dielectric layer therebetween whereby electric field is prevented from penetrating into the substrate.

2. The transistor of claim 1 wherein the first support dielectric layer comprises silicon nitride.

3. The transistor of claim 1 wherein the first support dielectric layer comprises silicon dioxide.

4. The transistor of claim 1 wherein the field termination electrode is ohmically connected to the collector.

5. The transistor of claim 1 wherein the thick dielectric layer comprises polyimide.

6. A method of producing a high-voltage bipolar transistor, said method comprising the steps of;

providing a substrate;

forming a collector on the substrate;

forming a base on a first portion of the collector;

forming an emitter on the base;

forming an emitter contact on the emitter;

forming a first support dielectric layer on a second portion of the collector and on a portion of the base;

forming a field termination electrode on the first support dielectric layer that contacts the collector;

forming a second dielectric layer over the field termination electrode;

forming a thick dielectric layer over exposed portions of the second dielectric layer, the first support dielectric layer, the emitter, and the emitter contact;

forming openings in the thick dielectric layer at locations for a bond pad, a pad interconnect, and base and emitter contacts; and forming a bond pad in an opening above the first support dielectric layer and field termination electrode and on the thick dielectric layer to contact the base to thereby provide a structure in which the bond pad overlaps the field termination electrode with a dielectric layer therebetween.

7. The method of claim 6 wherein the step of forming the first support dielectric layer comprises the step of forming a silicon nitride layer.

8. The method of claim 6 wherein the step of forming the first support dielectric layer comprises the step of forming a silicon dioxide layer.

9. The method of claim 6 wherein the step of forming the field termination electrode comprises the step of ohmically connecting the field termination electrode to the collector.

10. The method of claim 6 wherein the step of forming the thick dielectric layer comprises the step of forming a thick layer of polyimide.

* * * * *